(12) United States Patent
Crosby

(10) Patent No.: US 6,446,263 B1
(45) Date of Patent: Sep. 3, 2002

(54) ANTI-LOADING CATV INTERFACE CIRCUIT AND METHOD

(75) Inventor: John B. Crosby, Gold Beach, OR (US)

(73) Assignee: Multiplex Technology, Inc., Brea, CA (US)

( * ) Notice: Subject to any disclaimer, the term of this patent is extended or adjusted under 35 U.S.C. 154(b) by 0 days.

(21) Appl. No.: 09/303,481

(22) Filed: Apr. 30, 1999

(51) Int. Cl.[7] ............................... H04N 7/16; H01P 5/12

(52) U.S. Cl. ...................... 725/149; 333/125; 333/136; 330/99

(58) Field of Search .................. 725/118, 119, 725/127, 148, 149; 330/98, 99, 100; 333/124, 125, 136

(56) References Cited

U.S. PATENT DOCUMENTS

| | | | |
|---|---|---|---|
| 3,781,703 A | 12/1973 | Duty | |
| 3,987,240 A | 10/1976 | Schultz | |
| 4,118,600 A | 10/1978 | Ståhl | |
| 4,943,956 A | 7/1990 | Noro | |
| 5,130,664 A | 7/1992 | Pavlic et al. | |
| 5,208,854 A | 5/1993 | West, Jr. | |
| 5,245,420 A | 9/1993 | Harney et al. | |
| 5,815,040 A | * 9/1998 | Barbetta | ............ 330/264 |

* cited by examiner

*Primary Examiner*—Andrew Faile
*Assistant Examiner*—Hunter Lonsberry
(74) *Attorney, Agent, or Firm*—Lynn & Lynn

(57) ABSTRACT

A video interface circuit reduces loading losses when a video system component, such as a television receiver, is connected to a transmission line by amplifying the video signal with a high frequency amplifier and providing positive feedback of the amplified signal to the cable.

10 Claims, 2 Drawing Sheets

ANTI-LOADING CATV INTERFACE CIRCUIT AND METHOD

BACKGROUND OF THE INVENTION

This invention is directed generally to television signal distribution systems and particularly to systems using a cable to distribute multiple video signals to a plurality of video devices. This invention relates more particularly to apparatus and methods for connecting a video device to a single uninterrupted cable and reducing the disturbance caused by connecting the video device to the cable.

Most commercial signal distribution systems use a high-powered amplifier to drive signals down a single cable with signal taps used as drops to various outlets. To minimize impedance mismatches, the signal attenuation of the taps to each drop is high, on the order of 12 to 20 dB so that one or more very powerful and costly amplifiers are required to maintain the signal at an acceptable level.

Most residential cable TV distribution systems have a main cable that delivers video signals to the customer's home. Signal splitters are then used to connect "home run" cables between the main cable and video outlets. The result is sometimes referred to as a "star" network. Although the splitters supply the necessary impedance matching for each run, the total signal loss through the splitters often exceeds 12 dB, again requiring one or more expensive amplifiers.

There is a need in the art for a technique for allowing video devices to be connected directly to a single cable, thereby eliminating the signal losses associated with taps and/or splitters, while not disturbing the system's impedance match.

SUMMARY OF THE INVENTION

The present invention provides a video interface circuit that reduces loading losses when a video system component, such as a television receiver, is connected to a cable network.

The present invention includes an interface circuit connected to a signal tap in the cable for receiving video signals therefrom and producing an amplified video signal for delivery to the video device. An amplifier circuit and a passive positive feedback circuit are connected between the amplifier circuit output and the tap for introducing an amplified video signal into the cable network. The amplifier is capable of amplifying signal frequencies of up to 10 GHz or more so that the signal fed back into the cable does not cause signal distortion in the cable.

The interface circuit according to the present invention preferably comprises a first transistor circuit connected to the tap for receiving video signals therefrom. The invention preferably further includes a second transistor circuit arranged to receive signals from the first transistor circuit and produce an amplified video signal. The feedback circuit is connected between the second transistor circuit and the tap for introducing the amplified video signal into the transmission cable.

The feedback circuit preferably comprises a passive network connected between the amplifier output and the tap. The feedback circuit preferably provides a gain of 12 to 15 dB in the video signal that is introduced into the coaxial cable at the tap.

An appreciation of the objectives of the present invention and a more complete understanding of its structure and method of operation may be had by studying the following description of the preferred embodiment and by referring to the accompanying drawing.

DESCRIPTION OF THE PREFERRED EMBODIMENT

Figure 1:
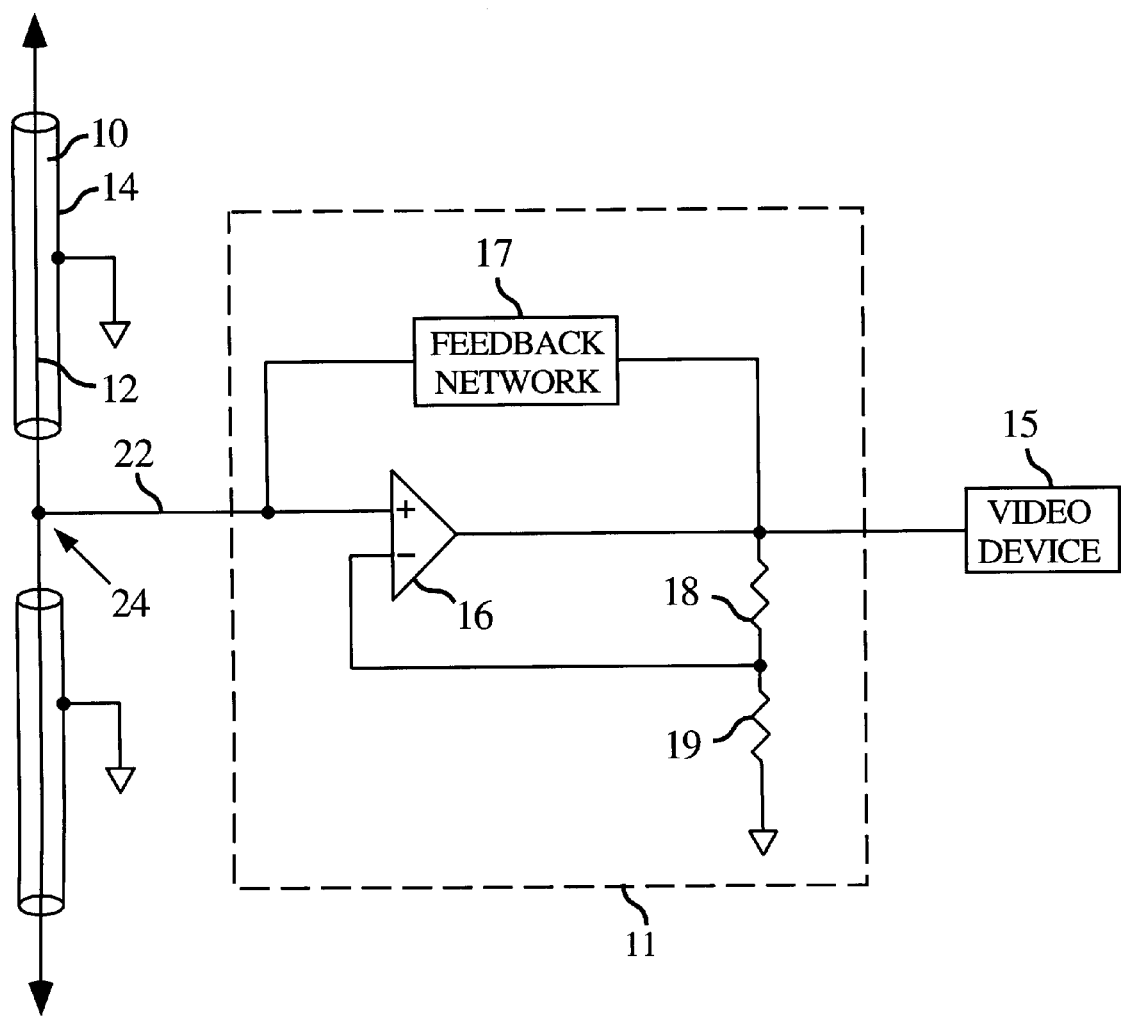
FIG. 1 is a generalized block diagram of the video interface circuit according to the present invention.
Figure 2:
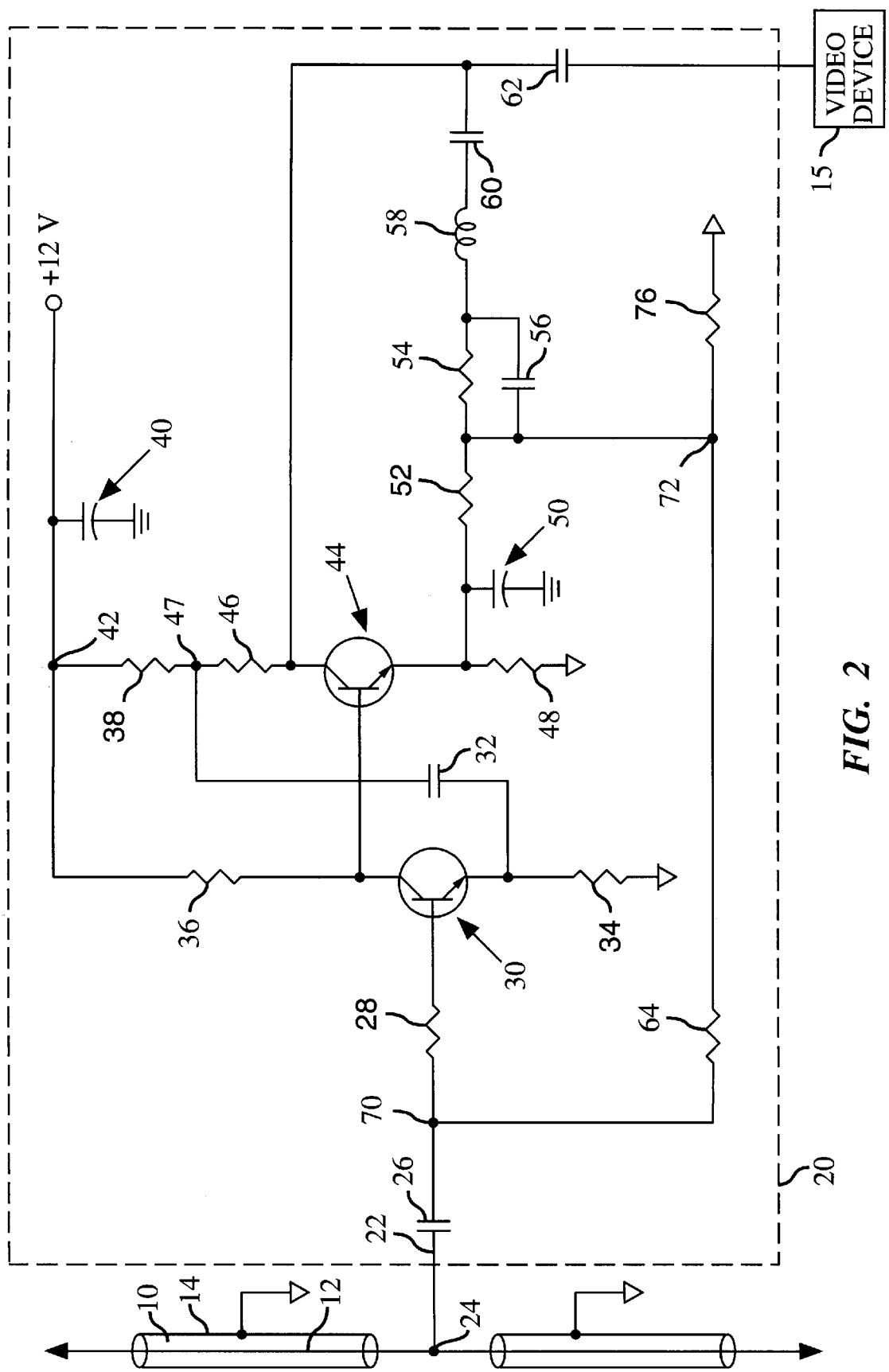
FIG. 2 is a schematic diagram of circuitry that forms a video interface circuit according to the present invention.

FIGS. 1 and 2 illustrate the basic principles of the invention. The invention is described with reference to the particular circuitry of FIGS. 1 and 2 only for the purpose of facilitating explanation of the basic principles of the invention. The present invention is not limited in its application to the specific circuitry shown and described herein.

Referring to FIG. 1, a video signal transmission cable 10 permits bi-directional propagation of video signals. The video signal transmission cable 10 is preferably a coaxial cable of the type commonly used in video systems. The coaxial cable 10 has a central conductor 12 and a shielding conductor 14, which is grounded. The shielding conductor 14 has a circular cross section. The center of the central conductor 12 is located at the center line of the shielding conductor 14. The central conductor 12 generally is a solid wire, and the shielding conductor 14 is braided from small wires.

An interface circuit 11 for connecting a video device 15 to the video signal transmission cable 10 comprises an amplifier 16, a feedback network 17 and a pair of resistors 18 and 19. A conductor 22 connects the non-inverting input of the amplifier 16 to a signal tap 24 formed in the video signal transmission cable 10. The feedback network 17 is connected between the non-inverting input and the output of the amplifier 16. The output of the amplifier 16 is also connected to the video device and to a first terminal of the resistor 18. The resistor 18 has a second terminal that is connected to the inverting input of the amplifier 16 and to a first terminal of a resistor 19. The resistor 19 has a second terminal that is grounded. Thus it is seen that the inverting input of the amplifier 16 is connected to the junction of the resistors 18 and 19. The video device 15 is connected to the junction of the amplifier 16 output, the resistor 18 and the feedback network 17.

Referring to FIG. 2, there is shown a schematic diagram of a preferred embodiment of a cable television interface circuit 20 according to the present invention. A coupling capacitor 26 is connected to the conductor 22 to block the transmission of DC and low frequency signals and only allow the transmission of RF signals. Therefore, the capacitor 26 has a high impedance for DC and low frequency signals and a low impedance for signals of the RF video frequency.

A resistor 28 is connected between the capacitor 26 and to the base of a transistor 30. The transistor 30 preferably is an NEC 85633 transistor or the equivalent. The basic requirement for the transistor 30 is that it be capable of operating with signal frequencies of up to 10 GHz or more. The resistor 28 reduces the Q of the input lead to the transistor 30 to suppress parasitic oscillations in the transistor 30.

The emitter of the transistor 30 is connected to a capacitor 32 and to one terminal of a first emitter degeneration resistor 34. The other terminal of the resistor 34 grounded. The capacitor 32 preferably has a capacitance of about 0.1 $\mu$F. The resistor 34 preferably has a resistance of about 39 $\Omega$.

The collector of the transistor 30 is connected to a first terminal of resistor 36. A second terminal of the resistor 36 is connected to a junction 42. A first terminal of a second emitter degeneration resistor 38, a capacitor 40 and a +12 volt power source are also connected to the junction 42. Thus the second terminal of the resistor 36 is connected to the resistor 38, the capacitor 40 and the +12 volt power source. The resistors 36 and 38 preferably have resistances of about 1 K Ω and 39 Ω, respectively. The capacitor 40 preferably has a capacitance of about 0.1 μF, which means that the junction of the resistors 36 and 38 is effectively at ground potential for the high frequency video signals.

Therefore, the emitter degeneration resistors 34 and 38 are connected in parallel for all AC frequencies of interest. The effective impedance seen by the emitter of the transistor 30 is about 19.5 Ω. The impedance of the emitter of the transistor 30 is about 5 Ω. which means that the combined impedance of the emitter and the resistors 34 and 38 is about 25 Ω. The amplifier has an effective impedance of about 2500 Ω for which the present invention compensates.

The collector of the transistor 30 is also connected to the base of a transistor 44, which also is preferably is an NEC 85633 transistor or the equivalent. The collector of the transistor 44 is connected to one end of a resistor 46. The other end of the resistor 46 is connected to the resistor 38 at a junction 47. The capacitor 32 is connected between the emitter of the transistor 30 and the junction 47 of the two resistors 38 and 46. The capacitor 32 thus functions as an AC short circuit between the junction 47 and the emitter of the transistor 30. A resistor 48 is connected between the emitter of the transistor 44 and ground. The transistor 44 inverts the signal at its collector and produces an output across the resistors 38 and 46. The resistors 38 and 46 preferably have a resistance ratio of 3:1, which results in a voltage division of 4:1.

A capacitor 50 is also connected between the emitter of the transistor 44 and ground. The resistors 46 and 48 preferably have resistance values of about 62 Ω and 82 Ω respectively. The capacitor 50 preferably has a capacitance of about 0.1 μF. so that the emitter of the transistor 44 is effectively grounded for the frequencies of the video signals.

The emitter of the transistor 44 is additionally connected to a first end of a resistor 52. The other end of the resistor 52 is connected to a resistor 54 and to a capacitor 56. The resistor 54 and the capacitor 56 are connected together in parallel between the resistor 54 and an inductor 58. A first terminal of a capacitor 60 is connected to the inductor 58 so that the capacitor 60 and the resistor 58 are in series. The other terminal of the capacitor 60 is connected to the collector of the transistor 44 and to a first terminal of a capacitor 62. The other terminal of the capacitor 62 is connected to a video device 63 that is arranged to receive video signals from the coaxial cable 10. Both of the resistors 52 and 54 preferably have resistance values of about 510 Ω. The inductor 58 preferably has an inductance of about 560 nH. The capacitor 60 preferably has a capacitance of about 1000 pF, and the capacitor 62 preferably has a capacitance of about 1000 pF.

A first terminal of a resistor 64 is connected between the capacitor 26 and the resistor 28 at a junction 70. The second terminal of the resistor 64 is connected to a junction 72 where the resistor 52 is connected to the parallel-connected resistor 54 and capacitor 56. A resistor 76 has a first terminal that is connected to the junction 72 and hence to the resistor 64. The other terminal of the resistor 76 is grounded. The resistors 64 and 76 preferably have resistances of about 1 KΩ and 510 Ω, respectively.

The interface circuit 20 may have resistance, inductance and capacitance values chosen to make the video device and interface circuit 20 transparent to the cable 10. To accomplish this desired result, the interface circuit 20 generates a negative impedance to compensate for loading losses caused by connecting the video interface circuit 20 to the cable 10.

Cable losses can cause limitations on the length of cable that may be used. These losses may be compensated for by having a negative input impedance at the tap that will give an overcompensation, which may be used to offset part of the cable line losses. The present invention may also have resistance and capacitance values chosen to compensate for both interface loading losses and cable losses, which makes it possible to maintain adequate signal strength on a single uninterrupted bus of up to 0.25 mile long without requiring additional amplification.

The video signal from the cable 10 passes though the capacitor 26 and resistor 28 to the base of the transistor 30. The video signal is output at the emitter of the transistor 30, which is connected to the resistor 46 at the junction 47. The video signal output to the video device 63 is taken at the collector of the transistor 44. An amplified video signal also appears at the emitter of the transistor 44. This amplified video signal is fed back to the coaxial cable 10 through the resistors 52 and 64 and the capacitor 26. In a preferred embodiment of the invention, the amplifier provides 12 dB of non-inverted gain. It has been found that a 12 dB gain, which corresponds to a voltage gain of 4, provides reasonable values of signal overload tolerance and noise in the network.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is claimed is:

1. An interface circuit for connecting a video device to a signal tap in a continuous transmission line having one or more electrical conductors without signal splitters for reducing signal losses caused by the video device and compensating for losses in the continuous transmission line without in-line amplification, comprising:

an amplifier circuit connected to at least one conductor of the continuous transmission line for receiving video signals therefrom and producing an amplified video signal at an amplifier output terminal for delivery to the video device; and a passive positive feedback circuit connected between the amplifier circuit output terminal and the continuous transmission line for introducing a compensating video signal into the continuous transmission line to compensate for loading causes by the amplifier circuit and the video device so that the interface circuit is transparent to the continuous transmission line.

2. The interface circuit of claim 1, further comprising:

a first resistor connected between the amplifier circuit output terminal and an inverting input of the amplifier circuit; and a second resistor connected between the inverting input of the amplifier circuit and ground.

3. The interface circuit of claim 1 wherein the feedback circuit provides a gain of 12 dB in the video signal that is introduced into the continuous transmission line.

4. An interface circuit for connecting a video device to a signal tap in a continuous transmission line without signal splitters and having one or more electrical conductors for reducing signal losses caused by connecting of the video device and compensating for losses in the continuous transmission line without in-line amplification, comprising:

- a first transistor circuit connected to the continuous transmission line for receiving video signals therefrom;
- a second transistor circuit connected between the first transistor circuit and the video device for receiving signals from the first transistor circuit and providing an amplified video signal for delivery to the video device; and
- a passive positive feedback circuit connected between the second transistor circuit and the continuous transmission line for introducing a compensating video signal into the continuous transmission line to compensate for loading of the transmission line caused the interface circuit and the video device so that the interface circuit is transparent to the continuous transmission line.

5. The interface circuit of claim 1 wherein the amplifier circuit comprises:

- a first transistor having its base of the first transistor arranged to receive the video signal from the continuous transmission line;
- a first resistor connected between the emitter of the first transistor and ground;
- a second resistor connected between the collector of the first transistor and a voltage source;
- a third resistor having a first terminal connected to the voltage source;
- a capacitor connected between the emitter of the first transistor and the second terminal of the third resistor;
- a second transistor having its base connected to the collector of the first transistor, the amplified video signal being provided at the collector of the second transistor; and
- a fourth resistor connected between the second terminal of the third resistor and the collector of the second transistor.

6. The interface circuit of claim 5 wherein the passive feedback network comprises an RLC circuit connected between the collector of the second transistor and the signal tap of the transmission line.

7. A method for connecting a video device to a signal tap in continuous transmission line without signal splitters and having one or more electrical conductors for reducing signal losses caused by connection of the video device to the continuous transmission line and compensating for losses in the continuous transmission line without in-line amplification, comprising the steps of:

- connecting an amplifier circuit to the continuous transmission line for receiving video signals therefrom;
- producing an amplified video signal at an amplifier output terminal for delivery to the video device; and
- connecting a passive positive feedback circuit between the amplifier circuit output terminal and the continuous transmission line for introducing a compensating video signal into the continuous transmission line to compensate for loading causes by the amplifier circuit and the video device so that the interface circuit is transparent to the continuous transmission line.

8. The method of claim 7, further comprising the steps of:

- connecting a first resistor between the amplifier circuit output and an inverting input of the amplifier circuit; and
- connecting a second resistor between the inverting input of the amplifier circuit and ground.

9. A method for connecting a video device to a signal tap in a continuous transmission line without signal splitters and having one or more electrical conductors for reducing signal losses caused by connecting of the video device and compensating for losses in the continuous transmission line without in-line amplification, comprising the steps of:

- connecting a first transistor circuit to the continuous transmission line for receiving video signals therefrom;
- connecting a second transistor circuit between the first transistor circuit and the video device for receiving the video signals from the first transistor circuit and producing an amplified video signal for delivery to the video device; and
- connecting a passive positive feedback circuit between the second transistor circuit and the continuous transmission line for introducing the amplified video signal into the transmission line.

10. The method of claim 9, further comprising the steps of:

- connecting the base of the first transistor to the continuous transmission line such that a first video signal is output at the emitter of the first transistor;
- connecting the collector of the first transistor to the base of the second transistor such that the amplified video signal is output at the emitter of the second transistor; and
- connecting a passive network between the emitter of the second transistor and the continuous transmission line to form the feedback circuit.

* * * * *